United States Patent [19]
Ladds

[11] Patent Number: 6,040,690
[45] Date of Patent: Mar. 21, 2000

[54] ELECTRICITY MEASUREMENT USING TWO CONDUCTORS

[75] Inventor: David Anthony Ladds, Bath, United Kingdom

[73] Assignee: Horstmann Timers & Controls Limited, United Kingdom

[21] Appl. No.: 08/875,031

[22] PCT Filed: Jan. 10, 1996

[86] PCT No.: PCT/GB96/00040

§ 371 Date: Oct. 28, 1997

§ 102(e) Date: Oct. 28, 1997

[87] PCT Pub. No.: WO96/22539

PCT Pub. Date: Jul. 25, 1996

[30] Foreign Application Priority Data

Jan. 18, 1995 [GB] United Kingdom ................ 9500974

[51] Int. Cl.[7] .................................................. G01R 19/00
[52] U.S. Cl. ................. 324/142; 324/117 H; 324/117 R
[58] Field of Search ........................... 324/117 H, 117 R, 324/251, 252, 225, 142, 126, 127; 327/73

[56] References Cited

U.S. PATENT DOCUMENTS

| | | |
|---|---|---|
| 3,323,057 | 5/1967 | Haley ...................................... 324/127 |
| 4,500,838 | 2/1985 | Bloomer . |
| 4,580,095 | 4/1986 | De Vries ................................. 324/126 |
| 4,926,116 | 5/1990 | Talisa .................................. 324/117 R |
| 5,017,804 | 5/1991 | Harnden et al. . |
| 5,172,052 | 12/1992 | Wells . |
| 5,192,877 | 3/1993 | Bitterbierre et al. ..................... 327/73 |

FOREIGN PATENT DOCUMENTS 0 107 059 A1  5/1984  European Pat. Off. .

OTHER PUBLICATIONS

International Search Report, Int'l Appln. No. PCT/GB96/00040, Int'l Filing Date Jan. 10, 1996, 3 pp.

Primary Examiner—Vinh P. Nguyen
Attorney, Agent, or Firm—Fish & Richardson P.C.

[57] ABSTRACT

An electricity measurement apparatus includes two spaced-apart parallel conductors through which current flows in the same direction inducing a magnetic field between the conductors. Two magnetic field sensors are disposed on each side of a first plane in which the conductors lie. The sensors are in a second plane that is substantially between the conductors and perpendicular to the first plane. An arithmetic processor processes signals from the sensors to provide a value representative of current flow. The provided value is substantially independent of the position of the second plane within the space between the conductors.

22 Claims, 6 Drawing Sheets

HORIZONTAL SYMMETRY AXIS

VERTICLE SYMMETRY AXIS

B = Bext + Bcoil

B = Bext − Bcoil

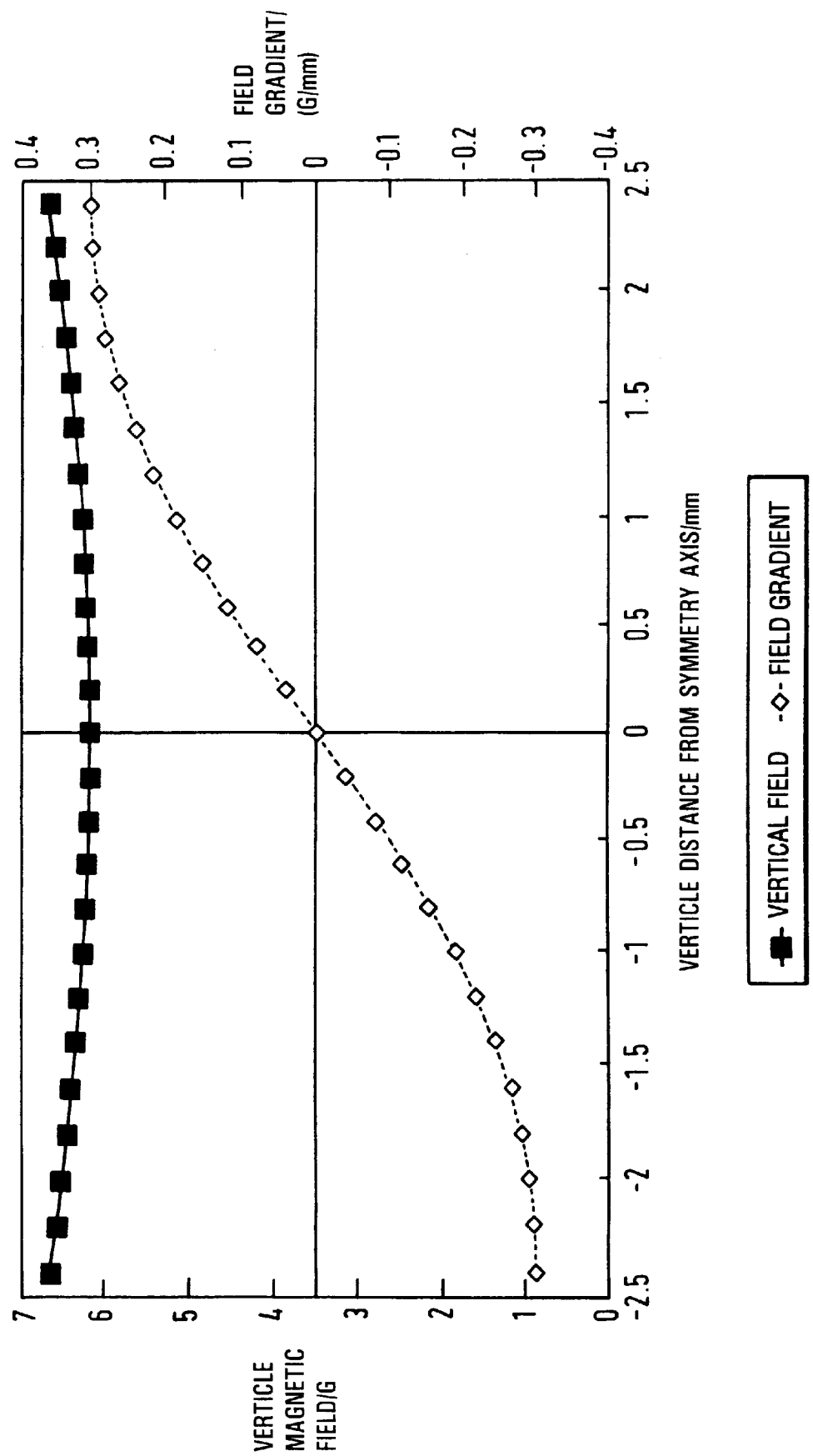
FIG. 10 VERTICAL

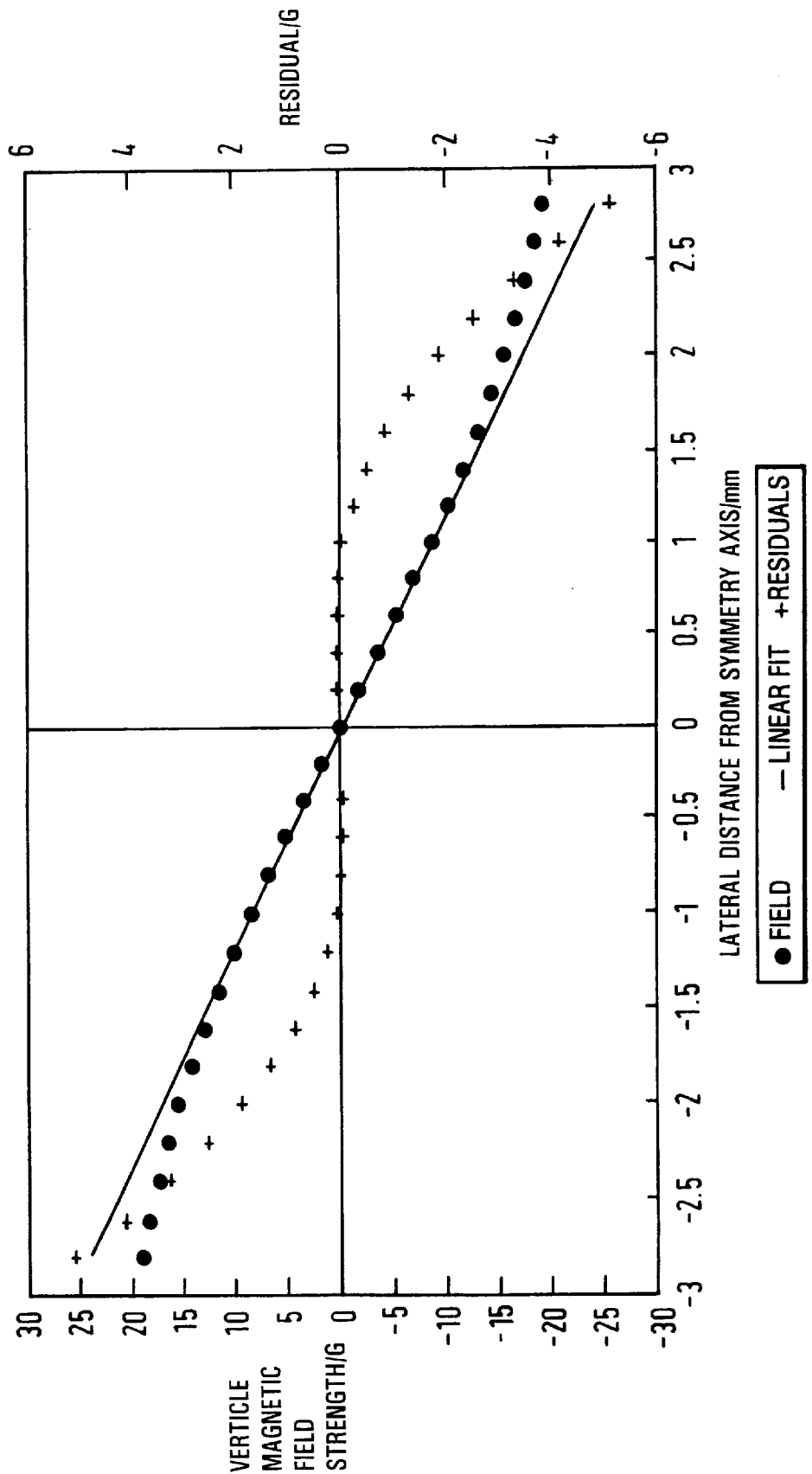
FIG. 11 HORIZONTAL

ELECTRICITY MEASUREMENT USING TWO CONDUCTORS

This is a continuation of International Patent Application No. PCT/GB96/00040, with an international filing date of Jan. 10, 1996, now pending.

The present invention relates to an electricity measurement apparatus and a method of electricity measurement, in particular for current measurement, power measurement and watt hour metering.

When current flows through a conductor, a rotational magnetic field is set up. The magnitude of this magnetic field is proportional to the density of current flowing:

$$B \alpha I/A. \qquad \text{(Equation 1)}$$

where I is the total current, and A is the cross sectional area of the conductor. This value I/A is the current density J.

It is known to use sensors to measure current flow through a conductor by detecting the magnetic field induced nearby. In the known art, magnetic field sensors for current measurement have been used individually such that the detected magnetic field is the sum of the rotational magnetic field due to current flow through the conductor and any external magnetic fields. To enable the accurate measurement of the rotational field a large amount of shielding is required to keep stray external magnetic fields away from the sensor as these would give rise to measurement inaccuracies, away from the sensor.

The present invention is defined in the claims to which reference should now be made. Preferred features are laid out in the sub-claims.

The present invention preferably provides an electrical measurement apparatus including two spaced-apart parallel conductors through which current flows in the same direction, a magnetic field being induced in the space between the conductors, and at least one magnetic field sensor disposed in that space.

The sensor or sensors are preferably disposed in the plane equidistant from the two conductors. The induced magnetic field in that plane is perpendicular to that plane, and sensors, in particular which detect field in that direction only, can operate with good accuracy.

These are preferably two sensors, one on either side of the central axis through the plane in which the conductors lie, the sensors providing signals representative of measured field strengths, and arithmetic processing means are provided operative to process the signals to provide a value representative of current flow. Components of the signals due to external magnetic fields cancel, giving improved accuracy.

It is preferred to position the two sensors in the plane equidistant from the two conductors or a plane parallel thereto. This has the advantage that the magnitudes of field components perpendicular to the plane vary linearly with sensor position within that plane. Errors in sensor misalignment can then be readily corrected for and there is less sensitivity to these errors than if a conventional single conductor were used.

There are several further advantages to the invention. In particular, no shielding is required around a sensor since the signal components due to external fields are removed. No magnetic concentrating cores are required, and both DC and AC external fields are automatically screened out. Another advantage is that the signal to noise ratio is increased and external magnetic field noise is efficiently removed.

Preferably, the two sensors are equidistant from the central axis. Errors due to an external magnetic field then cancel to zero.

It is preferred to position the two sensors in the plane equidistant from the two conductors. As there is a zero vertical field gradient in the direction between the conductors at this plane, misalignment of the sensors is least critical.

The two conductors are preferably of the same cross section, for example square, rectangular, circular or some other shape.

The two conductors are preferably arm parts of a single conductor in which a longitudinal slot is formed, the sensor or sensors being positioned in the slot.

The shape and configuration of the conductors is optimised to give good measurement accuracy, in particular, in view of the following advantages. A small conductor cross section gives a high current density and hence detected magnetic field intensity. A large conductor width gives a larger linear field region between the conductors. A large separation of conductors gives a larger space in which to place sensors, making small sensor size less critical. A relatively small separation of conductors gives increased magnetic field intensity and corresponding signal output. A large separation of two sensors gives a larger differential field measurement. A small separation of two sensors compared to the conductor width gives a larger linear field region in which sensor misalignment causes little error.

The sensors are preferably formed on, or as part of, an Integrated Circuit. Sensors can be readily positioned accurately on the Integrated Circuit which has a small robust construction. The arithmetic processing means can be included on the Integrated Circuit. Amplifiers of the signals provided from the sensors to the arithmetic processing means can also be included on the Integrated Circuit.

The Integrated Circuit can be dimensioned so as to fit the slot in the conductor. The fit can be snug. The Integrated Circuit can be mounted on a printed circuit board (PCB) such that the Integrated Circuit and PCB together fit the slot.

The arithmetic processing which is undertaken is preferably a differencing operation, in particular an addition or subtraction of signal values. The signals from the two sensors are added or subtracted such that external field components cancel whilst magnitudes of the two signals due to current flow along the conductor are summed. The signal values are preferably voltages.

The electricity measurement apparatus can be for current measurement, power measurement and/or watt hour determination.

It is preferred to use two sensors, however multiple pairs of sensors could be used, one member of each pair being positioned on either side of the conductor. Although this requires more arithmetic processing, an increased voltage output is provided, giving improved sensitivity.

The magnetic field sensors are preferably Hall-effect sensors. Of course, other magnetic field sensors can be used, such as inductive coils or current transformers.

In a second aspect, the present invention preferably provides a corresponding method of electrical measurement.

In a third aspect, the present invention preferably provides a conductor in which a longitudinal slot is formed so as to provide two conductive parts, the slot being adapted to fit at least one magnetic sensor.

A preferred embodiment of the present invention will now be described by way of example and with reference to the drawings in which:

FIG. 10 is a graph illustrating vertical field strength at various heights in the slot (i.e. in a vertical direction).

FIG. 11 is a graph illustrating vertical field strengths at various lateral positions across the slot (i.e. in a horizontal direction).

Figure 1:
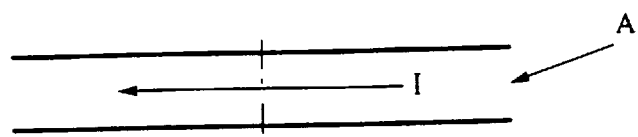
FIG. 1 is a diagram illustrating the basic principle of operation of a preferred embodiment of the present invention.
Figure 1:
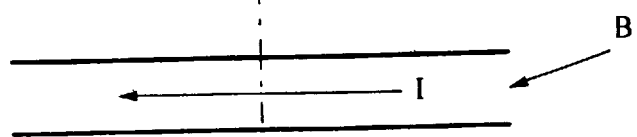
Figure 2:
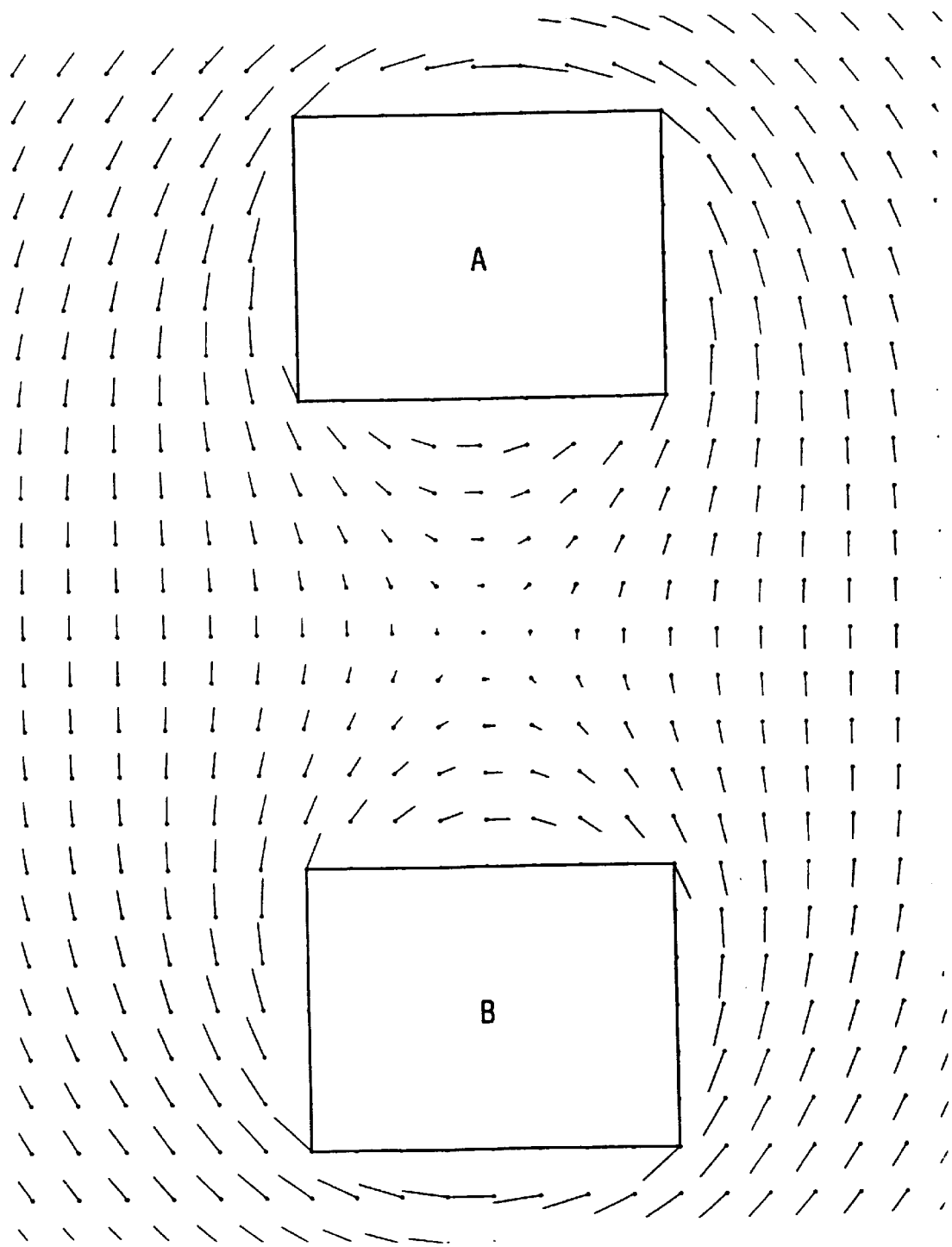
FIG. 2 is a schematic diagram illustrating induced magnetic fields due to current flow through two parallel conductors of rectangular cross section.
Figure 3:
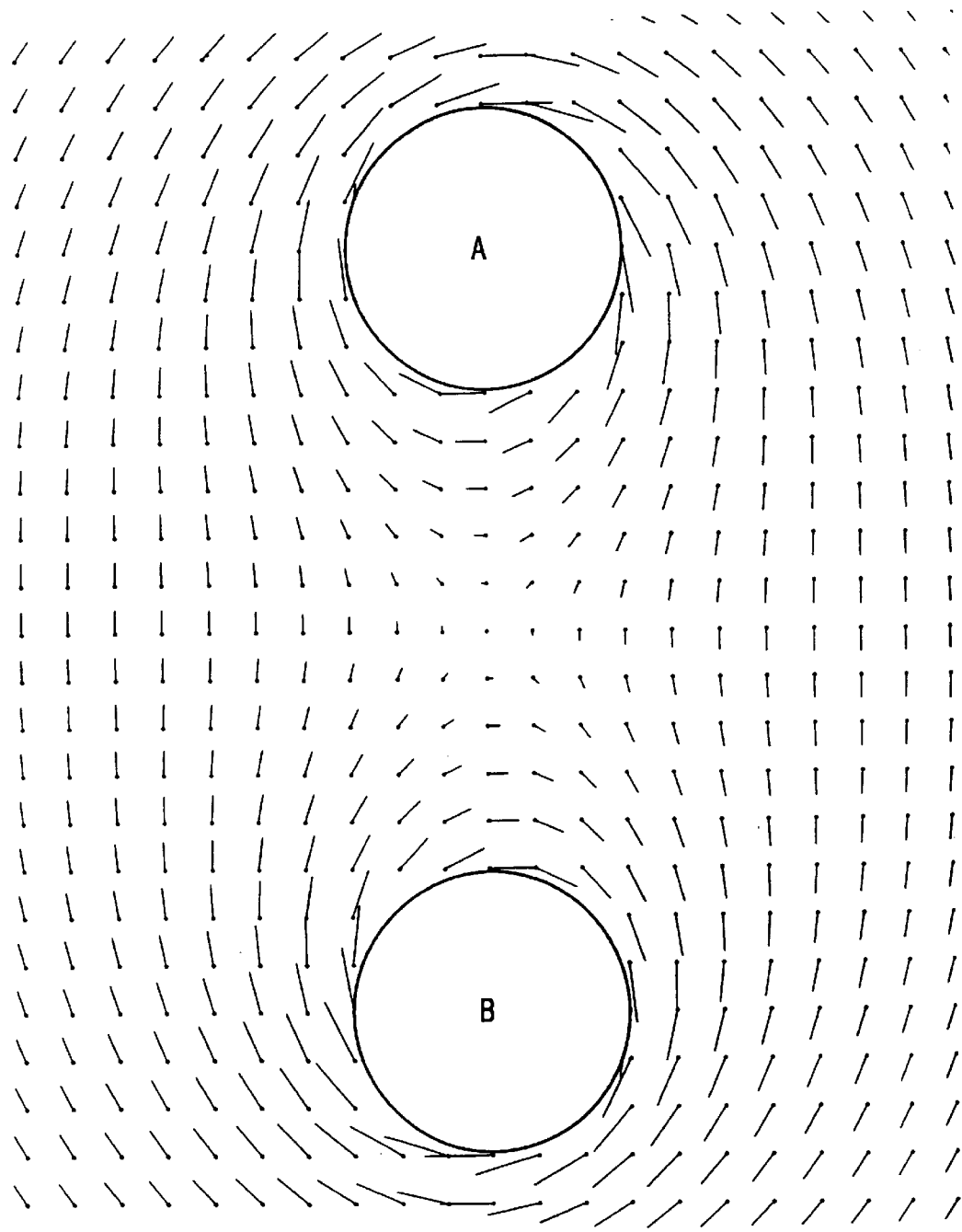
FIG. 3 is a schematic diagram illustrating induced magnetic fields due to current flow through two parallel conductors of round cross section.
Figure 6:
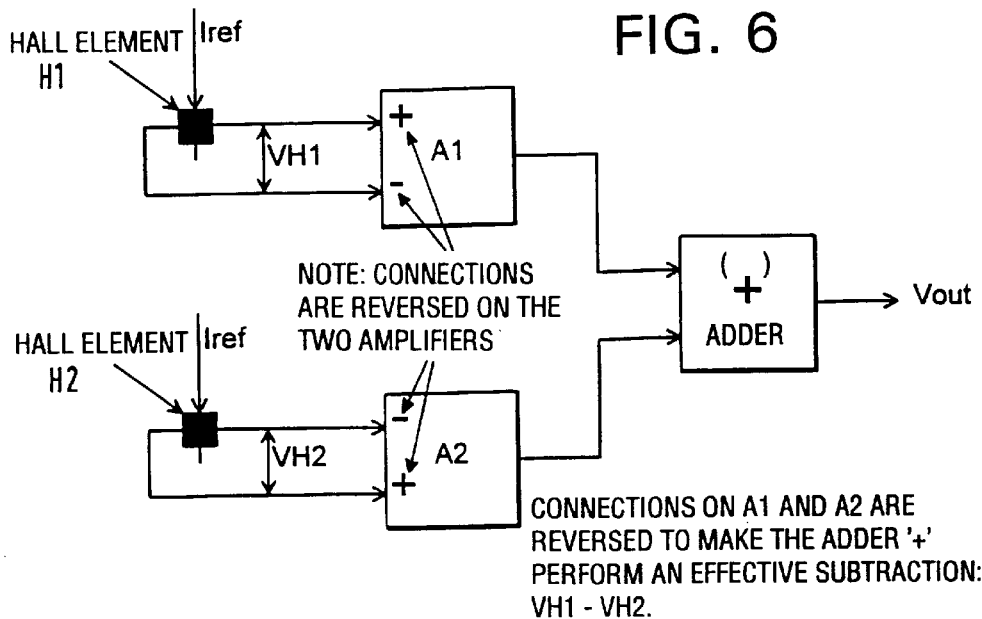
FIG. 6 is a diagram illustrating the electronic apparatus.

As shown in FIG. 1, two parallel conductors A,B are provided through which current I flows in the same direction. The conductors can be of a rectangular cross section as shown in FIG. 2, or circular cross section as shown in FIG. 3. The magnetic fields induced by current flow are shown diagrammatically in those figures.

Figure 4:
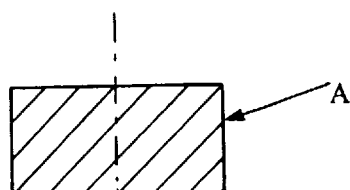
FIG. 4 is a cross sectional view illustrating the slotted conductor relative to which the sensors are to be positioned.
Figure 4:
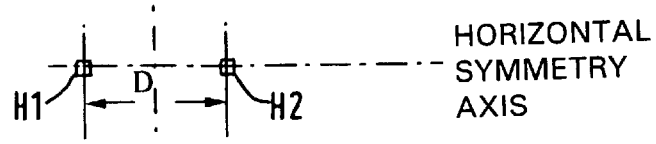
Figure 4:
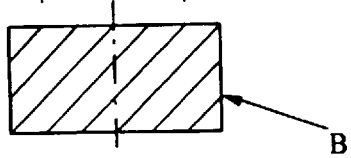

The two conductors A,B have two sensors H1, H2 disposed between them positioned on the horizontal symmetry axis and equidistant from the vertical symmetry axis, as shown in FIG. 4.

Figure 5:
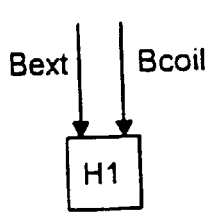
FIG. 5 is a schematic diagram illustrating the principle of operation with two sensors.
Figure 5:
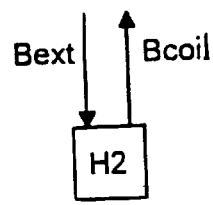

Having the two sensors H1, H2 positioned on either side allows the effect of external field $B_{ext}$ to be cancelled numerically. Both sensors are used in current measurements, as follows. Considering the vertical fields present on each conductor as shown in FIG. 5, at sensor H1 the field is given by "$B_{ext}+B_{coil}$" whereas at sensor H2 the field is given by "$B_{ext}-B_{coil}$". By determining the difference between the fields measured on each sensor the external field $B_{ext}$ is removed as follows:

$$B = (S1 \times B(H1)) - (S2 \times B(H2)) \quad \text{(Equation 2)}$$
$$= (S1 \times (B_{ext} + B_{coil})) - (S2 \times (B_{ext} - B_{coil}))$$
$$= 2 \times B_{coil},$$

where proportionality coefficients S1 and S2 are sensitivities of the sensors, and B(H2) is taken as negative and outputs a voltage Vout proportional to (S1×B(H1))−(S2×B(H2)) as mentioned above. Of course, B(H2) could be taken as positive and a subtraction performed.

Figure 7:
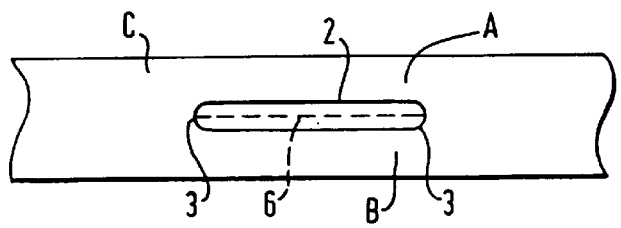
FIG. 7 is a diagrammatic side view of the slotted conductor.
Figure 8:
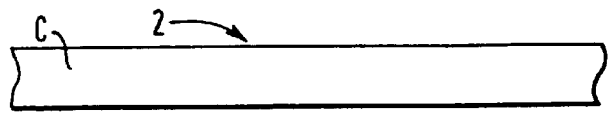
FIG. 8 is a diagrammatic plan view of the slotted conductor shown in FIG. 4.

As shown in FIG. 7 and 8, a rectangular strip C is provided with a slot 2 cut through the conductor, so as to divide into two arms which are the conductors A,B. The ends 3,3 of the slot 2 are rounded due to the method of manufacture.

Figure 9:
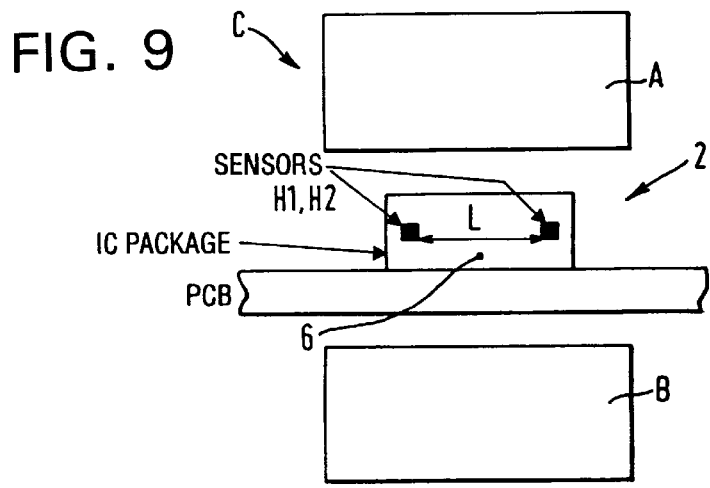
FIG. 9 is a diagrammatic sectional view through the slotted conductor showing sensors in position.

As shown in FIG. 9, the two conductors A,B are preferably each of rectangular cross-section. The two sensors H1, H2 are placed symmetrically in the slot 2 about the central axis 6 of the conductor to ensure that similar magnitude fields are detected, and correct cancellation of external field is performed.

The two sensors H1, H2 are preferably implemented on a single Integrated circuit (IC) chip together with all the associated amplifier A1, A2 and adder (+) circuitry, the IC being mounted on a PCB. The IC and PCB are inserted into the slot 2 so as to be a snug-fit between the two conductors A,B.

The vertical magnetic field components within the slot in the vertical and horizontal directions are illustrated graphically in FIGS. 10 and 11 respectively. These show field data assuming that the conductors A,B are made of brass and have dimensions of 4 mm by 3 mm separated by a 6 mm gap. It will be seen that the field is a vertical direction (FIG. 10) is fairly constant such that vertical mis-positioning of the sensors ceases to be a significant source of error. Indeed the sensors can be placed in any vertical plane within the slot.

It can also be seen from FIG. 11 that the variation of field strength with lateral position is linear. Errors due to non-equidistant positioning are readily corrected for. A calibration to determine the appropriate correction is made by applying a known current through the conductor, and comparing the actual with the expected voltage output.

By measuring within a slot, accuracy is substantially independent of vertical positioning. Conversely, if only a single conductor was used having a single rectangular cross-section throughout, an error in positioning the sensors of only 0.1 mm might lead to an error in the electricity flow detected of say 7%. In the horizontal direction there is also a lower sensitivity to sensor misalignment, than if a slot were not used.

I claim:

1. An electricity measurement apparatus comprising:
    two spaced-apart parallel conductors through which current flows in a same direction, a magnetic field being induced in the space at least substantially between the conductors,
    two magnetic field sensors disposed in the space, the sensors disposed one on each side of a first plane in which the conductors lie, the sensors providing signals representative of measured field strengths,
    and an arithmetic processor provided to process the signals to provide a value representative of current flow, said value being dependent on the current flow in each conductor,
    in which the two sensors are positioned in a second plane passing between the conductors and perpendicular to the first plane, the provided value representative of current flow being substantially independent of the position of the second plane within the space between the conductors.

2. An electricity measurement apparatus according to claim 1, in which the second plane is equidistant from the conductors.

3. An electricity measurement apparatus according to claim 2, in which the magnetic field induced by the conductors in the second plane is in a direction perpendicular to the second plane, and the sensors detect a magnetic field in that direction only.

4. An electricity measurement apparatus according to claim 1 further configured to operate in the presence of an external magnetic field from a source other than the current in the conductors, in which upon processing by the arithmetic processing means, signals due to the external magnetic field at least substantially cancel.

5. An electricity measurement apparatus according to claim 4, in which the arithmetic processing means undertakes a differencing operation on the signal values.

6. An electricity measurement apparatus according to claim 5, in which the signals from the two sensors are added or subtracted such that external field components cancel whilst magnitudes of the two signals due to current flow along the conductor are summed.

7. An electricity measurement apparatus according to claim 6 in which the signal values are voltages.

8. An electricity measurement apparatus according to claim 1 further configured to operate in the presence of an external magnetic field from a source other than the current in the conductors, in which the two sensors are equidistant from the plane in which the conductors lie such that signals due to the external magnetic field then cancel to zero.

9. An electricity measurement apparatus according to claim 1, in which the two conductors are of the same cross section.

10. An electricity measurement apparatus according to claim 9, in which the cross section of the two conductors is square, rectangular or circular.

11. An electricity measurement apparatus according to claim 1, in which the two conductors are arm parts of a single conductor in which a longitudinal slot is formed, the sensor or sensors being positioned in the slot.

12. An electricity measurement apparatus according to claim 1, in which the sensors are formed on, or as part of, an Integrated Circuit.

13. An electricity measurement apparatus according to claim 12, in which arithmetic processing means operative to process signals from the sensors is included on, or as part of, the Integrated Circuit.

14. An electricity measurement apparatus according to claim 12, in which amplifiers of the signals provided from the sensors are included on, or as part of, the Integrated Circuit.

15. An electricity measurement apparatus according to claim 12, in which the two conductors are arm parts of a single conductor in which a longitudinal slot is formed, and the Integrated Circuit is dimensioned so as to fit the slot in the conductor.

16. An electricity measurement apparatus according to claim 12, in which the two conductors are arm parts of a single conductor in which a longitudinal slot is formed and the Integrated Circuit is mounted on a printed circuit board (PCB) such that the Integrated Circuit and PCB together fit the slot.

17. An electricity measurement apparatus according to claim 1, further configured for at least one of current measurement, power measurement or watt hour determination.

18. An electricity measurement apparatus according to claim 1, in which multiple pairs of sensors are used for increased sensitivity, one member of each pair being positioned on either side of the conductor.

19. An electricity measurement apparatus according to claim 1 in which the magnetic field sensors are Hall-effect sensors.

20. An electricity measurement method comprising:

providing two spaced-apart parallel conductors through which current flows in the same direction;

sensing a magnetic field in a space substantially between the two conductors so as to detect electricity flow comprising:

disposing two magnetic field sensors in a space at least substantially between the two parallel conductors, such that the sensors are disposed one on each side of a first plane in which the conductors lie and such that the two sensors also lie in a second plane perpendicular to the first plane, providing from each sensor a signal representative of the measured field strength; and processing the signals to produce a value representative of current flow which is substantially independent of the position of the second plane within the space between the conductors, said value being dependent on the current flow of each conductor.

21. An electricity measurement method according to claim 20, in which the processing comprises differencing the signals such that components due to an external magnetic field which is not due to the current in the conductors at least substantially cancel.

22. An electricity measurement apparatus comprising:

two spaced-apart parallel conductors through which current flows in the same direction, a magnetic field being induced in a space at least substantially between the conductors, two magnetic field sensors disposed in the space, the sensors being disposed one on each side of a first plane in which the conductors lie, the sensors being positioned in a second plane perpendicular to the first plane, the sensors providing signals representative of measured field strengths, and an arithmetic processor provided to process the signals to provide a value representative of current flow, said value being substantially independent of the position of the second plane within the space between the conductors, said processor being configured such that said value is dependent on the current flow in each conductor.

* * * * *